United States Patent
Dray et al.

(10) Patent No.: US 6,728,135 B2
(45) Date of Patent: Apr. 27, 2004

(54) MEMORY CELL OF THE FAMOS TYPE HAVING SEVERAL PROGRAMMING LOGIC LEVELS

(75) Inventors: Cyrille Dray, Grenoble (FR); Daniel Caspar, Saint Hilaire du Tovet (FR); Richard Fournel, Lumbin (FR)

(73) Assignee: STMicroelectronics S.A., Montrouge (FR)

( * ) Notice: Subject to any disclaimer, the term of this patent is extended or adjusted under 35 U.S.C. 154(b) by 15 days.

(21) Appl. No.: 10/228,164

(22) Filed: Aug. 26, 2002

(65) Prior Publication Data

US 2003/0063498 A1 Apr. 3, 2003

(30) Foreign Application Priority Data

Sep. 3, 2001 (FR) .............................. 01 11381

(51) Int. Cl.[7] .............................................. G11C 16/00
(52) U.S. Cl. .................................. 365/185.03; 257/317
(58) Field of Search ...................... 365/185.03, 185.18, 365/185.1; 257/314, 317

(56) References Cited

U.S. PATENT DOCUMENTS 6,125,053 A * 9/2000 Diorio et al. .......... 365/185.03

* cited by examiner

Primary Examiner—Tan T. Nguyen
(74) Attorney, Agent, or Firm—Lisa K. Jorgenson; Jon A. Gibbons; Fleit, Kain, Gibbons, Gutman, Bongini & Bianco P.L.

(57) ABSTRACT

The FAMOS memory location comprises a single floating gate (GR) overlapping an active surface of a semiconductor substrate according to at least two asymmetrical overlap profiles (PF1, PF2) so as to define at least two electrodes in the active region. Memory location programming means (MC, SW) are capable of selectively applying different predetermined sets of bias voltages to the electrodes so as to confer at least three programming logic levels on the memory location.

21 Claims, 2 Drawing Sheets

MEMORY CELL OF THE FAMOS TYPE HAVING SEVERAL PROGRAMMING LOGIC LEVELS

CROSS REFERENCE TO RELATED APPLICATIONS

This application is based upon and claims priority from prior French Patent Application No. 0111381, filed Sep. 3, 2001, the disclosure of which is hereby incorporated by reference in its entirety.

BACKGROUND OF THE INVENTION

1. Field of the Invention

The present invention generally relates to integrated circuits, and more particularly to memory cells or memory locations of the FAMOS-type (Floating-Gate Avalanche-Injection MOS), that is to say those based on a FAMOS-type transistor.

2. Description of Related Art

It will be recalled that the FAMOS (Floating-Gate Avalanche-Injection MOS) technology uses the memory location obtained with a p-type MOS transistor, the single gate of which is isolated and not electrically connected. This single gate is therefore floating.

This memory location may be obtained without adding further steps to the basic technological process for the fabrication of a p-type MOS transistor. Unlike the other memory locations, for example of the FLASH, EPROM or EEPROM type, which comprise a floating gate and a control gate, the FAMOS memory cell comprises only a single floating gate.

To erase a FAMOS memory location, ultraviolet radiation may be employed. This type of memory location is more particularly used as an OTP (one-time programmable) memory.

At the present time, the configuration of a FAMOS memory cell relies on a linear transistor, such as one having a rectangular gate overlapping an active region and thus defining the two, source and drain, electrodes of the transistor. The memory location is therefore perfectly symmetrical and its electrical characteristics in programming mode and in read mode are independent of the way in which the transistor is connected up.

The only possibility of then having several programming levels, and therefore several read levels, for example four programming levels, i.e., 2 bits/memory cell, is for the programming time to be finely controlled, thereby allowing more or fewer charges to be injected into the floating gate.

However, such a method is extremely difficult to implement and requires a critical control mechanism so as to guarantee a temporal programming window compatible with the performance of the read circuit. Accordingly, a need exists to overcome this difficulty and to provide a memory cell of FAMOS type having several programming logic levels.

SUMMARY OF THE INVENTION

The present invention provides a FAMOS memory location capable of having at least three if not more, completely natural programming levels, that is, levels which are solely dependent on the physical characteristics of the memory location and on the various bias voltages applied, but being independent of the length of time these bias voltages are applied beyond a certain saturation time, typically of the order of 1 ms. In fact, according to the present invention, the memory location will naturally reach, by itself, beyond this saturation time, an equilibrium corresponding to a programming level depending merely on the bias voltages applied.

The invention therefore provides a memory device, comprising a FAMOS memory location having a single floating gate overlapping an active surface of a semiconductor substrate according to at least two asymmetrical overlap profiles so as to define at least two electrodes in the active region. Moreover, the device includes memory location programming means capable of selectively applying different predetermined sets of bias voltages to the electrodes so as to confer at least three programming logic levels on the memory location.

The FAMOS memory location according to the present invention has an asymmetrical configuration. It therefore provides for several separate programming levels to be created "naturally", according to the bias voltages applied to the various electrodes. After a certain time, the memory location reaches its equilibrium by itself as regards the number of charges injected into the gate, thereby making it possible to define a programming logic level.

Moreover, such a FAMOS cell according to the present invention requires no modification to the conventional CMOS fabrication process, especially with regard to the implantations. It is only the geometry of the gate, in combination with different sets of bias voltages, which allows the various programming levels to be obtained. In other words, the memory location according to the invention is directly compatible with a CMOS logic process, which by nature is not designed for the production of non-volatile memory cells.

According to one embodiment of the invention, the floating gate overlaps the active surface according to two asymmetrical overlap profiles so as to define two electrodes. This is especially the case when the gate has an annular configuration.

One of the three programming logic levels corresponds, for example, to an erased memory location, the programming means then applying no bias voltage to the electrodes of the memory location.

Moreover, to confer a second programming logic level on the memory location, the programming means define, for example, a first electrode as being the drain of the memory location transistor and the second electrode as being the source of the transistor and apply corresponding first predetermined source and drain bias voltages.

To confer a third programming logic level on the memory location, the programming means define, for example, the first electrode as being the source of the memory location transistor and the second electrode as being the drain of the transistor, and apply corresponding second predetermined bias voltages.

In practice, the programming means may, for example, apply in the first case a voltage of 0 volts to the first electrode and 5 volts to the second electrode and apply in the second case a voltage of 5 volts to the first electrode and 0 volts to the second electrode.

When the gate has an annular configuration, the first electrode may be defined as being the central electrode located inside the gate, while the second electrode may be defined as being the peripheral electrode located outside the gate.

According to another embodiment of the invention, the floating gate has a figure-eight configuration defining a peripheral electrode located outside the gate, a first central electrode located inside the first loop of the eight and a second central electrode located inside the second loop of the eight. The memory location programming means are then capable of selectively applying different sets of predetermined bias voltages to the electrodes so as to confer more than three, for example four or even more, programming logic levels on the memory location.

In this regard, the programming means may define one of the three electrodes as being the drain of the memory location transistor, another of the three electrodes as being the source of the transistor and the third electrode as being a control electrode. The programming means are therefore capable, for example, of applying corresponding bias voltages to the source and to the drain and of selectively applying different voltages, lying between the source voltage and the drain voltage, to the control electrode so as to obtain different programming logic levels, respectively.

Of course, it is also possible to invert the source and the drain in order to obtain even more programming logic levels.

It is also possible for one of the programming logic levels to correspond to an erased memory location, the programming means then applying no bias voltage to the electrodes of the memory location.

As an example, the peripheral electrode may correspond to the source of the transistor and the drain may correspond to one of the two central electrodes.

The device according to the invention also advantageously includes means for reading the programming logic levels, which means are capable of applying specific bias voltages to the source and to the drain of the memory location transistor so as to allow the drain current to be measured.

Advantageously, a higher drain current may be obtained when the source is considered in read mode as being the peripheral electrode.

The subject of the invention is also an integrated circuit comprising at least one memory device as defined above.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from examining the detail description of entirely non-limiting embodiments and the appended drawings.

DETAILED DESCRIPTION OF AN EMBODIMENT

Figure 1:
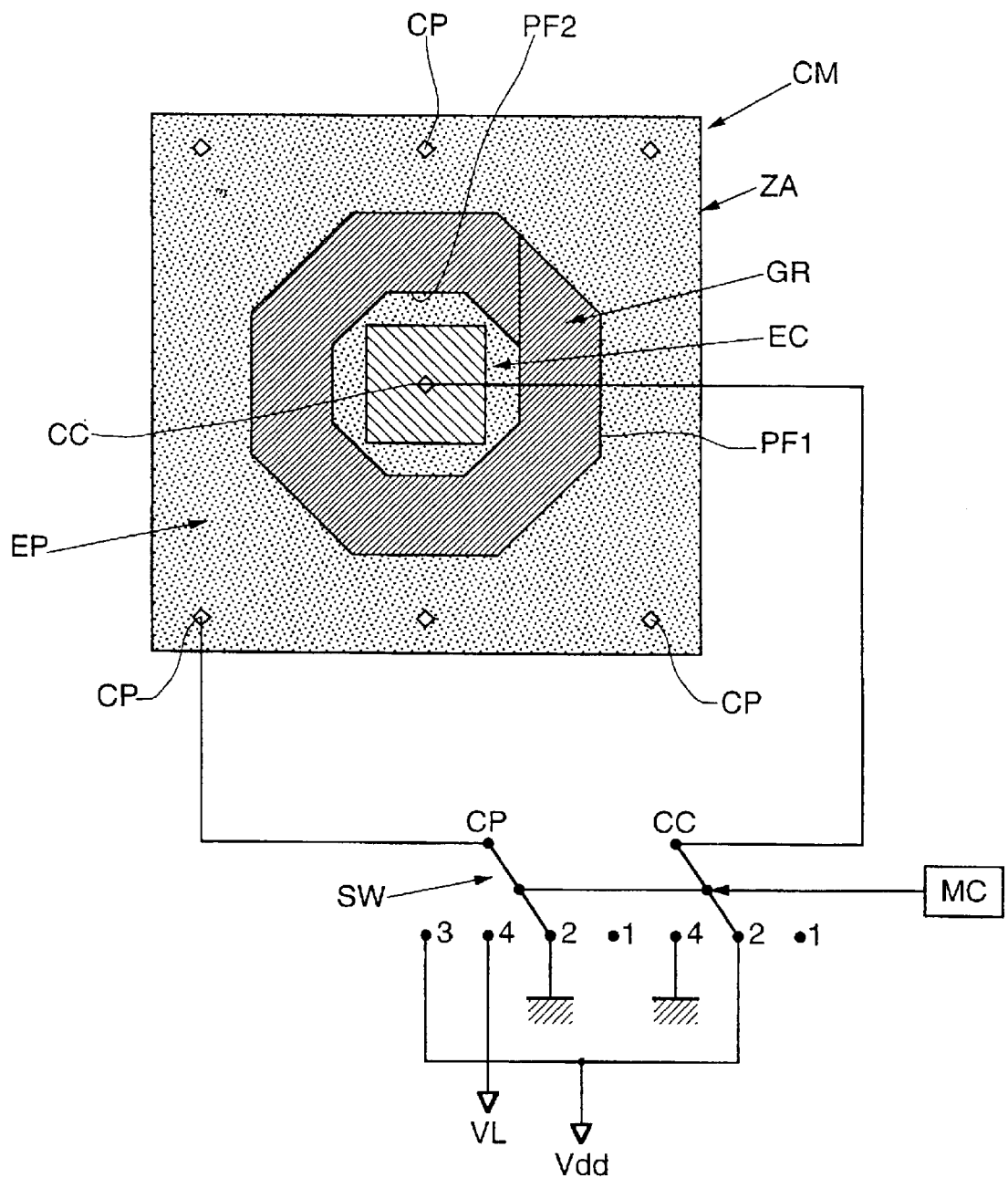
FIG. 1 illustrates a first embodiment of a memory device according to the invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

In FIG. 1, the reference CM denotes a FAMOS memory location. This memory location comprises, in an active region ZA of a silicon substrate, surrounded by an isolating region (not shown here for the sake of simplification), for example of the "shallow trench" type, a gate GR of a pMOS transistor. This gate GR is a floating gate, that is to say it not electrically connected. It rests on the active area via a gate oxide layer, for example made of silicon dioxide.

The gate GR has an annular configuration and consequently overlaps the active region according to two asymmetrical profiles, namely an outer (perimeter) profile PF1 which is longer than the inner perimeter PF2.

The gate GR therefore defines in the active region a first, central electrode EC and a second, peripheral electrode EP. A contact pad CC is placed on the central electrode EC in order to receive a bias voltage. Moreover, the peripheral electrode is provided with several contact pads CP in order again to receive a bias voltage.

Because of the asymmetrical character of the overlap profiles PF1 and PF2, the gate/central electrode coupling capacitance is lower than the gate/peripheral electrode coupling capacitance.

It is this feature which combined with different sets of bias voltages, makes it possible to obtain several natural programming levels for the memory location CM.

FIG. 1 shows programming means in the highly schematic form of a switch SW controlled by control means MC and capable of assuming various positions, allowing various sets of bias voltages to be applied to the contacts of the memory location electrodes. Physically, these programming means may be easily produced by a person skilled in the art in the form of logic circuits comprising, for example, gates and multiplexers.

A first programming level is obtained with an erased memory location. In this case, no bias voltage is applied to the electrodes of the memory location, and the two branches of the switch SW lie on the points 1.

A second programming level is obtained by placing the two branches of the switch SW on the points 2. In this way, the contact CC of the central electrode is connected to the supply voltage Vdd, for example +5 volts, while the contact CP of the peripheral electrode is connected to earth.

In such a configuration, the peripheral electrode EP is then the drain of the pMOS transistor, while the central electrode is the source of the pMOS transistor.

The third programming level is obtained by connecting the contact CP to the point 3 and by connecting the contact CC to the central point 2 which is connected to earth. In this case, it is the central electrode EC which acts as drain and the peripheral electrode which acts as source.

Because of the difference in gate/source and gate/drain coupling capacitance, the number of charges injected into the gate will be higher when the drain is at the center than when the drain is around the periphery.

The programming logic levels are read by applying a specific source/drain read voltage Vds, typically of the order of −1 volt. Measures will in fact be taken to ensure that too high a threshold voltage is not exceeded so as not to program the memory location undesirably. Thus, by way of indication, a source voltage of 0 volts and a drain voltage of −1 volt will be chosen.

Reading may be carried out by choosing the source as peripheral electrode and the drain as central electrode, or vise versa. However, to obtain a higher drain current, it is advantageous in read mode to choose the drain as peripheral electrode. This is because, since the drain voltage is lower than the source voltage, the potential of the gate will be taken to a negative potential since the gate preferably follows the potential of the peripheral electrode. Consequently, the gate/source voltage is higher in this configuration than the gate/source voltage which would be obtained with a drain taken at the central electrode. This therefore results in greater conduction of the transistor and consequently a higher drain current.

In FIG. 1, the reading operation is carried out by operating the switch SW so as to connect the contact CP to the point 4, which is connected to the voltage VL, equal to −1 volt, and so as to connect the contact CC to the other point 4, which is connected to earth. In this way, the drain is therefore around the periphery in read mode.

The measured drain current level allows the three programming levels to be differentiated. More specifically, when the memory cell was in the erased state the pMOS transistor is off, which means a drain current of the order of a few picoamps is obtained. When the memory cell has been programmed with the source at the center and the drain around the periphery, the drain current will be in the order of about a hundred $\mu A$. This drain current will be higher, for example three times higher, when the memory cell has been programmed with the drain at the center and the source around the periphery.

Figure 2:
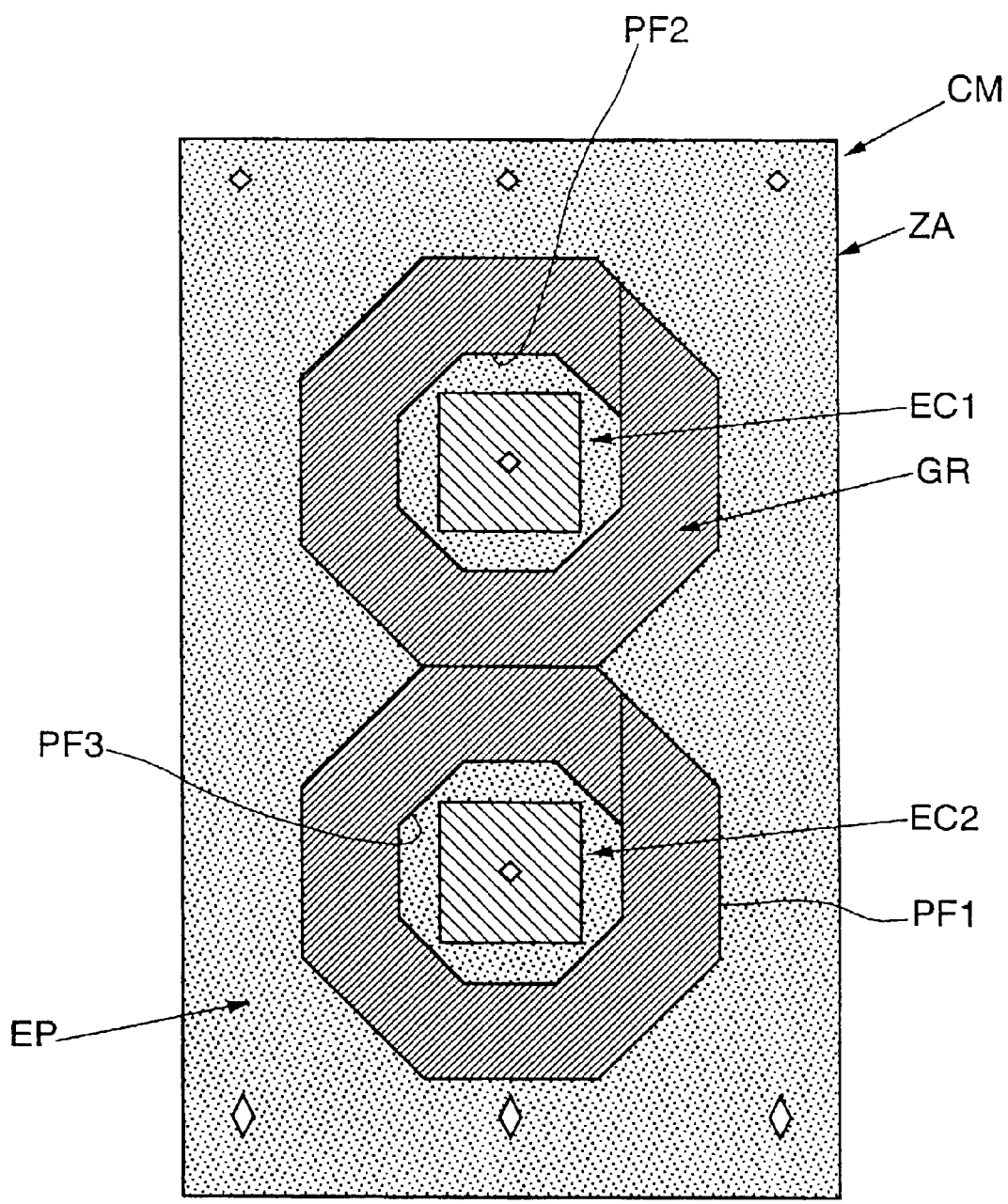
FIG. 2 illustrates a second embodiment of a memory location according to the invention.

In the embodiment shown in FIG. 2, the gate has a figure-eight configuration. It consequently overlaps the active region ZA along three overlap profiles PF1, PF2 and PF3. The outer overlap profile is different from the two inner overlap profiles PF2 and PF3 which correspond to the inner perimeters of the two loops of the eight respectively.

The floating gate thus defines a peripheral electrode EP lying outside the gate GR, a first central electrode EC1 lying inside the first loop of the eight and a second central electrode EC2 lying inside the second loop of the eight.

It is then possible to define, for example, the central electrode EC1 as being the drain of the pMOS transistor and the peripheral electrode EP as being the source of the pMOS transistor. The second central electrode EC2 is then regarded as being a control electrode.

More specifically, as an example of how to program the memory cell, 5 volts will be applied to the source and 0 volts will be applied to the drain. This results in a first programming logic level.

Next, several different values of the bias voltage will be selectively applied to the control electrode EC2, this bias voltage lying between the source voltage and the drain voltage. Each control voltage value will modify the number of charges injected into the gate and consequently confer a different programming logic state. Four programming levels can therefore be easily obtained.

The number of programming levels may be further increased by combining the use of this control voltage with reversal of polarity of the source and drain voltages, so as to define the drain around the periphery and the source in the first loop of the eight.

Of course, as in the previous embodiment, one of the programming logic levels may correspond to an erased memory location, the programming means then applying no bias voltage to the electrodes of the memory location.

With regard to reading the programming levels of this memory cell CM, this is carried out in a similar way to that described above in the case of the previous embodiment.

Whatever the embodiment used, the memory cell may be associated, in an integrated circuit, with several other similar memory cells in a matrix configuration. A memory plane is therefore obtained which is particularly compact in terms of number of cells and which offers a large number of possible coding combinations.

The invention is not limited to the embodiments that have just been described, rather it encompasses all variants thereof. Thus, it is possible to envisage any other asymmetrical overlap profile of the gate. However, an annular profile is advantageous as it allows better retention of the stored data, without modifying the profile of the isolation zones surrounding the active region. The scope of the invention is not to be restricted, therefore, to the specific embodiment, and it is intended that the appended claims cover any and all such applications, modifications, and embodiments within the scope of the present invention.

What is claimed is:

1. A memory device comprising:
   a FAMOS (Floating-Gate Avalanche-Injection MOS) memory location having a floating gate overlapping an active surface of a semiconductor substrate with at least two asymmetrical overlap profiles, so as to define at least two electrodes in an active region; and
   a programming means capable of selectively applying different predetermined sets of bias voltages to the electrodes so as to confer at least three programming logic levels on the FAMOS memory location.

2. The memory device according to claim 1, wherein the memory programming means includes one or more gates.

3. The memory device according to claim 1, wherein the floating gate overlaps the active surface with two asymmetrical overlap profiles, so as to define at least two electrodes, further comprises:
   a first programming logic level with the programming means applying no bias voltage to a source and a drain of the at least two electrodes of the memory location;
   a second programming logic level with the programming means applying a first predetermined bias voltage on at least one of the source and the drain; and
   a third programming logic level with the programming means applying a second predetermined bias voltage on at least one of the source and the drain.

4. The memory device according to claim 3, wherein the floating gate has an annular configuration defining a first electrode as being a central electrode located inside the gate, and the second electrode of the at least two electrodes as being a peripheral electrode located outside the gate.

5. The memory device according to claim 4, wherein the at least two asymmetrical overlap profiles result in a coupling capacitance of the central electrode that is lower than coupling capacitance of the peripheral electrode.

6. The memory device according to claim 1, further comprises a switch means and a control means for reading the programming logic levels, whereby the switch and control means are capable of applying specific bias voltages to a source and to a drain of the memory location transistor so as to allow the drain current to be measured.

7. The memory device according to claim 1, wherein the floating gate further comprises:
   a figure-eight configuration defining a peripheral electrode located outside the floating gate;
   a first central electrode located inside a first loop of the figure-eight; and
   a second central electrode located inside a second loop of the figure-eight;
   wherein the memory location programming means is capable of selectively applying different sets of predetermined bias voltages to the electrodes so as to confer more than three programming logic levels on the memory location.

8. The memory device according to claim 7, wherein the at least two asymmetrical overlap profiles result in a coupling capacitance of the central electrode coupling capacitance that is lower than coupling a capacitance of the peripheral electrode.

9. The memory device according to claim 8, wherein the programming logic levels corresponds to an erased memory location, the programming means then applying no bias voltage to the electrodes of the memory location.

10. The memory device according to one of claim 9, wherein the peripheral electrode corresponds a source and a drain corresponds to one of the first central electrode and the second central electrode.

11. The memory device according to one of claim 8, wherein the peripheral electrode corresponds to a source and a drain corresponds to one of the first central electrode and the second central electrode.

12. The memory device according to claim 7, wherein the first central electrode is a drain of the memory location transistor, the peripheral electrode is a source of the transistor, and the second central electrode is a control electrode; and wherein the programming means is capable of applying corresponding bias voltages to the source and to the drain and selectively applying different voltages to the control electrode, at voltage levels between a source voltage and a drain voltage, so as to obtain different programming logic levels.

13. The memory device according to claim 12, wherein the programming logic levels corresponds to an erased memory location, the programming means then applying no bias voltage to the electrodes of the memory location.

14. The memory device according to one of claim 12, wherein the peripheral electrode corresponds to a source and a drain corresponds to one of the first central electrode and the second central electrode.

15. The memory device according to claim 14, further comprises a switch means and a control means for reading the programming logic levels, whereby the switch and control means are capable of applying specific bias voltages to the source and to the drain so as to allow the drain current to be measured.

16. The memory device according to claim 7, wherein the programming logic levels corresponds to an erased memory location, the programming means then applying no bias voltage to the electrodes of the memory location.

17. The memory device according to one of claim 16, wherein the peripheral electrode corresponds to a source and a drain corresponds to one of the first central electrode and the second central electrode.

18. The device according to claim 17, wherein the source is the peripheral electrode.

19. The memory device according to one of claim 7, wherein the peripheral electrode corresponds to a source and a drain corresponds to one of the first central electrode and the second central electrode.

20. The memory device according to claim 1, further comprises a switch means and a control means for reading the programming logic levels, whereby the switch and control means are capable of applying specific bias voltages to a source and to a drain of the memory location transistor so as to allow the drain current to be measured.

21. A integrated circuit comprising:
at least once memory device comprising:
a FAMOS (Floating-Gate Avalanche-Injection MOS) memory location having a floating gate overlapping an active surface of a semiconductor substrate with at least two asymmetrical overlap profiles, so as to define at least two electrodes in an active region; and
a programming means capable of selectively applying different predetermined sets of bias voltages to the electrodes so as to confer at least three programming logic levels on the FAMOS memory location.

* * * * *